United States Patent [19]

König et al.

[11] Patent Number: 5,587,327
[45] Date of Patent: Dec. 24, 1996

[54] PROCESS FOR PREPARING A HETEROJUNCTION BIPOLAR TRANSISTOR

[75] Inventors: Ulf König; Andreas Gruhle, both of Ulm; Andreas Schüppen, Brackenheim; Horst Kibbel, Erbach; Harry Dietrich, Kirchhardt; Heinz-Achim Hefner, Brackenheim, all of Germany

[73] Assignees: Daimler Benz AG, Stuttgart; Temictelefunken Microelectronic GmbH, Heilbronn, both of Germany

[21] Appl. No.: 447,947

[22] Filed: May 23, 1995

[30] Foreign Application Priority Data

May 24, 1994 [DE] Germany ............... 44 17 916.2

[51] Int. Cl.⁶ ......................................... H01L 21/265
[52] U.S. Cl. ............... 437/31; 437/99; 437/126; 437/131; 437/228; 437/33; 148/DIG. 11; 148/DIG. 72; 148/DIG. 117; 257/197; 257/592
[58] Field of Search ................. 437/31, 33, 126, 437/131, 99, 228; 148/DIG. 72, DIG. 11, DIG. 117; 257/197, 592

[56] References Cited

U.S. PATENT DOCUMENTS

| 4,339,767 | 7/1982 | Horng et al. ............ 357/44 |
|---|---|---|
| 4,381,201 | 4/1983 | Sakurai ................. 148/1.5 |
| 4,569,700 | 2/1986 | toyama ................. 148/174 |
| 4,663,881 | 5/1987 | Birritella . | |
| 4,824,799 | 4/1989 | Komatsu ............... 437/99 |
| 4,833,097 | 5/1989 | Butler et al. .......... 437/29 |
| 5,106,767 | 4/1992 | Comfort et al. ........ 437/99 |
| 5,110,757 | 5/1992 | Arst et al. ............ 437/99 |
| 5,185,286 | 2/1993 | Eguchi ................. 437/99 |
| 5,296,391 | 3/1994 | Sato et al. ........... 437/99 |
| 5,494,836 | 2/1996 | Imai .................. 437/99 |

FOREIGN PATENT DOCUMENTS

| 0189136A3 | 7/1986 | European Pat. Off. . |
|---|---|---|
| 0375965A1 | 11/1989 | European Pat. Off. . |
| 0355799A2 | 2/1990 | European Pat. Off. . |
| 0430279A2 | 11/1990 | European Pat. Off. . |
| 0507454A1 | 10/1992 | European Pat. Off. . |
| 0550962A2 | 7/1993 | European Pat. Off. . |
| 4102888A1 | 8/1991 | Germany . |
| 0124564 | 5/1988 | Japan ................. 437/99 |

OTHER PUBLICATIONS

J. N. Burghartz, T. O. Sedgwick, D. A. Grützmacher, D. Nguyen-Ngoc and K. A. Jenkins, Proceedings of the 1993 Bipolar/Bicoms Circuits . . . IEEE 1993 Bipolar Circuits and Technology Meeting, 4:1.

*Primary Examiner*—George Fourson
*Assistant Examiner*—Long Pham
*Attorney, Agent, or Firm*—McGlew and Tuttle

[57] ABSTRACT

A process for preparing a bipolar transistor for very high frequencies is described, which is especially advantageous for the preparation of heterobipolar transistors and leads to components with low parasitic capacities and low base lead resistance. The process includes forming a structured first layer with collector zone and insulation areas surrounding the collector zone on a monocrystalline lead layer. A series of monocrystalline transistor layers are grown on the first layer over the collector zone by differential epitaxy and a series of polycrystalline layers is grown at the same time over the insulation areas. A series of polycrystalline layers is designed as a base lead.

13 Claims, 7 Drawing Sheets

PROCESS FOR PREPARING A HETEROJUNCTION BIPOLAR TRANSISTOR

FIELD OF THE INVENTION

The present invention pertains to a process for preparing a bipolar transistor.

BACKGROUND OF THE INVENTION

The use of transistors in the area of highly integrated or multifunctional circuits requires a reduction in the dimensions of the components and an increase in the speed of the function of the components. Besides the usual bipolar transistors (BJT), interest is increasingly paid to the heterobipolar transistors (HBT) as well.

A bipolar transistor can be operated up to a maximum frequency of fmax, at which its power amplification has dropped to 1.

The frequency fmax is inversely proportional to the square root of the product of the capacitance $C_{BC}$ between the base B and the collector C and the base resistance $R_B$. The collector-base capacitance is determined by the size of the emitter surface and the parasitic capacitances, which are inevitably caused by the base contacts. The resistance $R_B$ is determined essentially by the doping and the thickness of the base, the conductivity of the metallic lead and the contact resistances.

To reduce parasitic collector capacities, it has been known from EP 0 355 799 A2 and U.S. Pat. No. 4,663,831 that the active transistor areas with equal lateral dimensions can be increased by etching a vertical groove in a series of layers of polycrystalline semiconductor material and/or insulating material and depositing the series of transistor layers in the groove. The leads to deeper transistor layers are formed by separate horizontal zones.

It has been known from EP 0 189 136 that a highly doped polycrystalline zone surrounding the base area is provided as a diffusion source for preparing highly doped base contact areas, and the base lead is formed by these base contact areas, the polycrystalline zone and a silicide layer, in order to reduce the base lead resistance of a series of transistor layers.

SUMMARY AND OBJECTS OF THE INVENTION

The primary object of the present invention is to provide a process for preparing a bipolar transistor, especially a heterobipolar transistor, with which components with advantageous maximum frequency properties can be prepared in a simple manner.

According to the invention, a process for preparing a bipolar transistor is provided including preparing a structured first layer with a collector zone and with insulation areas surrounding the collector zone, the structured first layer is prepared on a monocrystalline lead layer (connection layer—e.g. not Pb). A series of monocrystalline transistor layers are grown on the first layer over the collector zone by differential epitaxy. A series of polycrystalline layers is grown at the same time over the insulation areas. The series of polycrystalline layers are designed as a base lead.

The insulation areas are preferably selectively prepared in a collector layer for the structured first layer. The insulation layers preferably may be prepared by local oxidation of the semiconductor material of the collector layer. The insulation areas may also be prepared by etching grooves and depositing insulation material in the grooves.

A window is preferably exposed to the lead layer in an insulation layer for the structured first layer. Monocrystalline semiconductor material is epitaxially deposited in the window in a selective manner for the collector zone. For the deposition of the collector zone, the differential epitaxial step is carried out in the same epitaxial process by changing the process parameters. An emitter zone is exposed within the series of monocrystalline layers. The series of monocrystalline layers is preferably grown as a series of layers of a heterobipolar transistor with a slightly doped emitter layer. The polycrystalline layer corresponding to the slightly doped emitter layer is used as part of the base lead. The polycrystalline layer corresponding to the slightly doped emitter layer is preferably transdoped to the conductivity type of the base layer. The transdoping is preferably performed by ion implantation.

The polycrystalline base layer is preferably partially converted into a silicide. The boundaries between the polycrystalline material and the monocrystalline material are included in the transdoping and/or the silicide conversion. A ring formed of a material shielding the transdoping and/or the silicide conversion is prepared along the exposed lateral boundary surfaces of the active emitter zone. Deformed SiGe is grown for the base layer.

An essentially flat surface is formed as the basis for the differentially epitaxial growth due to the prestructuring of the first layer with insulation areas, so that a transistor structure is formed during the subsequent differential epitaxy, in which the polycrystalline lead layer automatically comes to lie at the level of the monocrystalline base layer in the vertical direction, on the one hand, and the monocrystalline transistor layers are formed self-adjustingly with equal lateral dimensions one on top of another, on the other hand. Parasitic capacities are minimized due to the equal lateral dimensions of the transistor zones and to the insulation areas under the base lead. The present invention is particularly advantageous for the preparation of a heterobipolar transistor, in which a highly doped and therefore low-resistance polycrystalline lead layer is formed due to the high doping of the base layer, and in which the polycrystalline layer corresponding to the slightly doped emitter layer can be additionally used as a base lead due to a change in conductivity.

The present invention will be described in detail below on the basis of exemplary embodiments, with reference to the figures. The preparation of an npn-heterobipolar transistor on a silicon substrate is selected as the preferred example.

The various features of novelty which characterize the invention are pointed out with particularity in the claims annexed to and forming a part of this disclosure. For a better understanding of the invention, its operating advantages and specific objects attained by its uses, reference is made to the accompanying drawings and descriptive matter in which preferred embodiments of the invention are illustrated.

DETAILED DESCRIPTION OF THE PREFERRED EMBODIMENTS

Figure 1A:
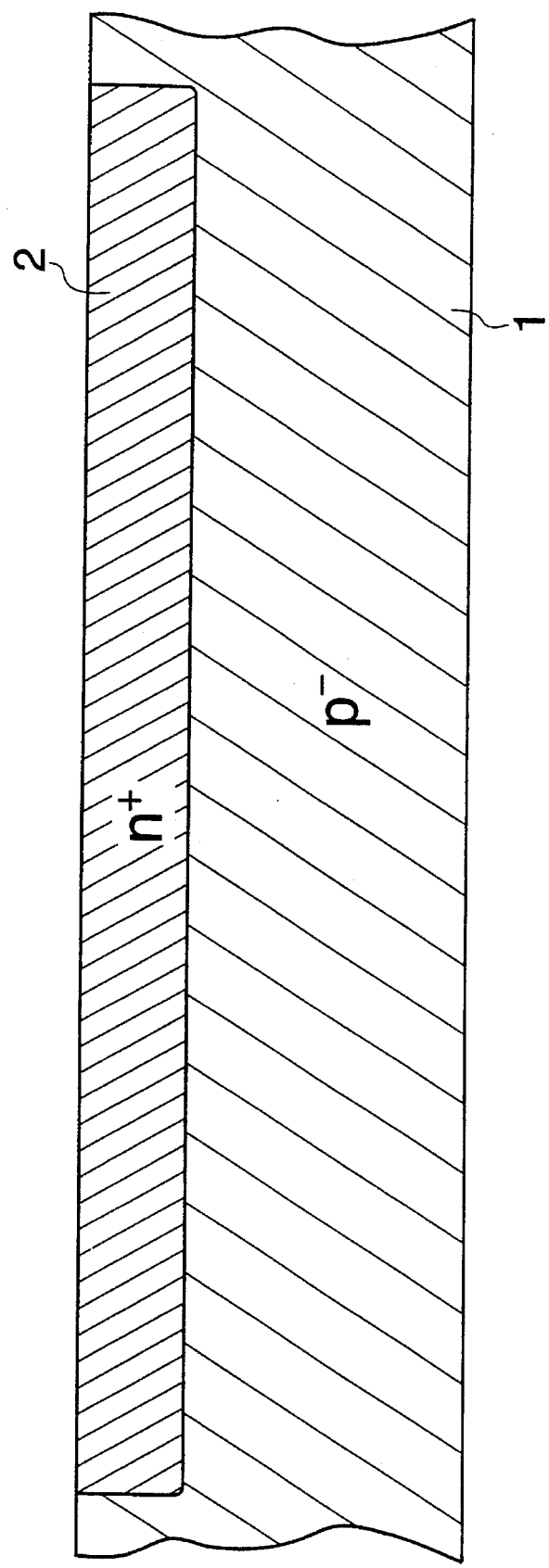
FIG. 1a is a sectional view showing an $n^+$-doped trough prepared in a slightly p-doped substrate.
Figure 1B:
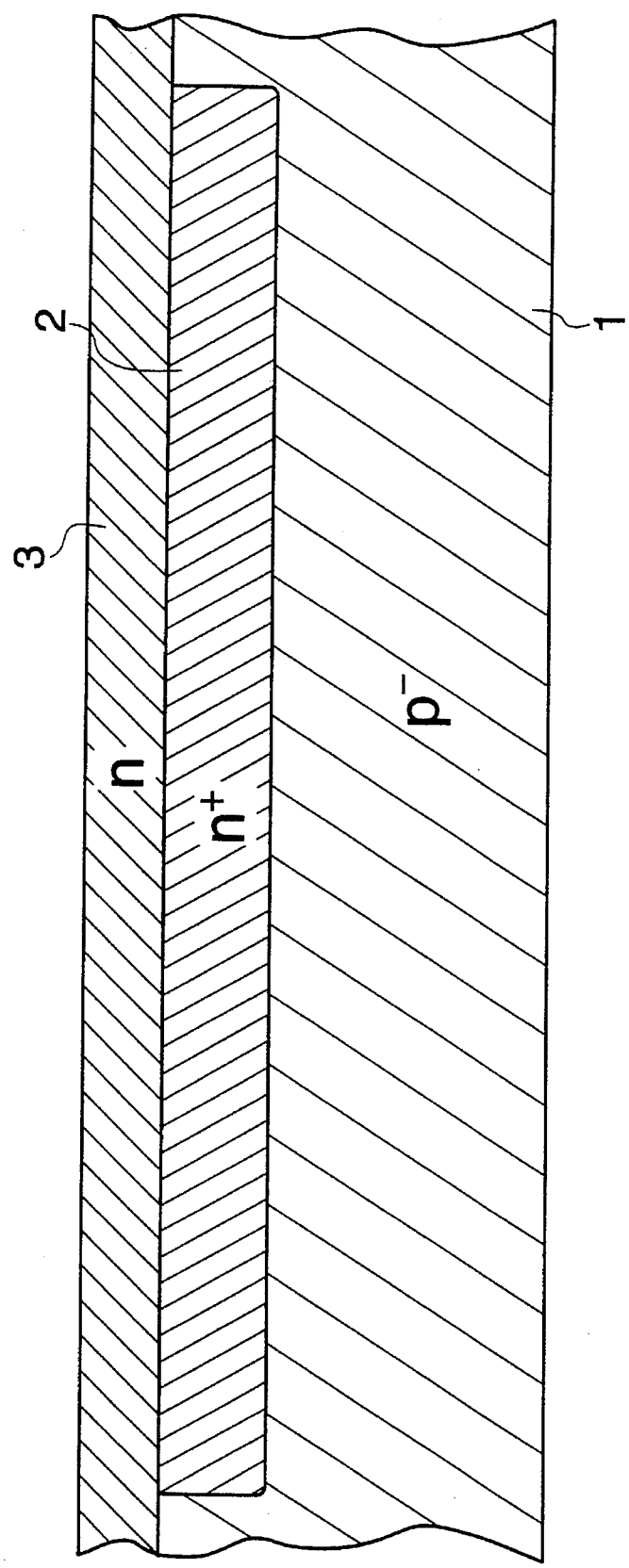
FIG. 1b is a sectional view similar to FIG. 1a with the addition of a collector layer.
Figure 1C:
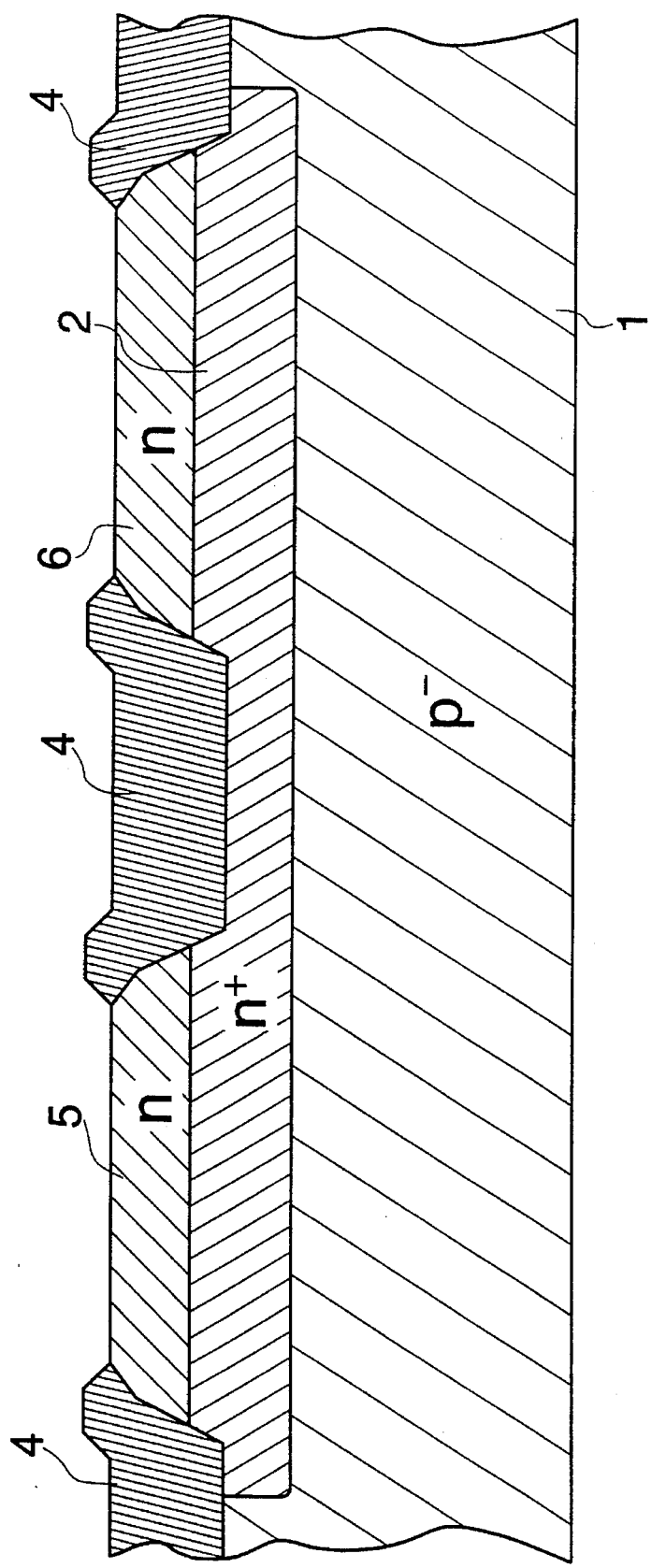
FIG. 1c is a sectional view similar to FIG. 1b showing insulation areas which define collector zones.

A highly $n^+$-doped trough 2 is prepared in a slightly $p^-$-doped substrate 1 in the usual manner, e.g., by implantation with subsequent diffusion (FIG. 1a). This trough 2 is used as a recessed, low-ohmic collector lead layer in the finished transistor. A collector layer 3, whose n-doping is selected corresponding to the intended doping of the collector zone of the transistor, is grown on the substrate 1 with the trough 2 (FIG. 1b). Insulation areas 4, which preferably extend into the substrate 1 or the trough 2 and define a collector zone 5 and a collector contact zone 6 in the collector layer 3, are prepared in this layer, e.g., by photolithographic structuring and local oxidation of the semiconductor material (LOCOS or recessed LOCOS) (FIG. 1c). The insulation step makes it possible to prepare a plurality of component structures and at the same time to separate the components.

The preparation of insulation areas 4 in the semiconductor material of the collector layer 3 may be replaced with a separation by the structured etching of grooves and by filling them up with insulating material or with another prior-art separation process.

Figure 1D:
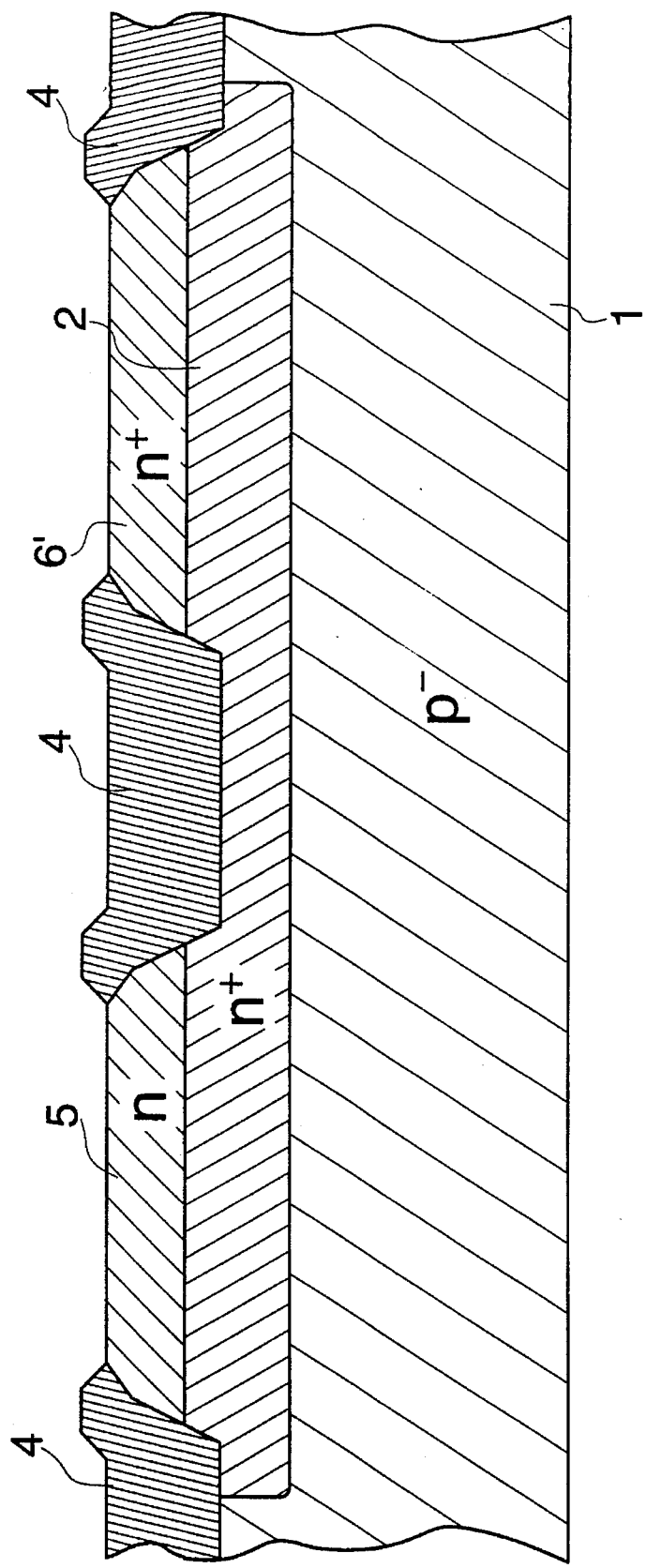
FIG. 1d is a sectional view similar to FIG. 1c showing a more highly doped collector contact.

A more highly doped collector contact 6' extending into the trough 2 can be prepared in the known manner, e.g., by a local implantation in the collector contact zone 6 (FIG. 1d).

Figure 1E:
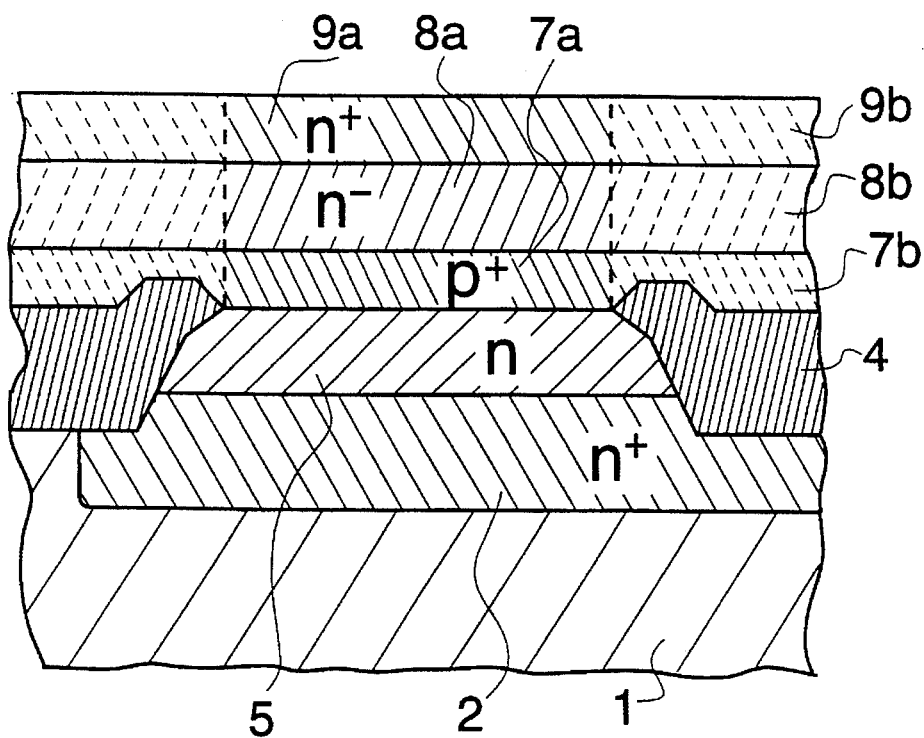
FIG. 1e is a cross sectional view similar to FIG. 1d, showing a series of layers, subsequently deposited on the surface of the structured collector layer.

A series of layers is subsequently deposited by differential epitaxy on the surface of the structured collector layer 3, which is flat, aside from possible minor bulges at the edges of the insulation areas (FIG. 1c); this series of layers grows as a monocrystalline, highly $p^+$-doped base layer 7a, as a slightly $n^-$-doped emitter layer 8a and as a highly doped emitter contact layer 9a over the collector zone 5, and at the same time, as a series of polycrystalline layers 7b, 8b, 9b of a corresponding doping over the insulation areas (FIG. 1e).

For preparing a heterobipolar transistor on an Si substrate, the base layer 7a preferably consists of strained SiGe.

Figure 1F:
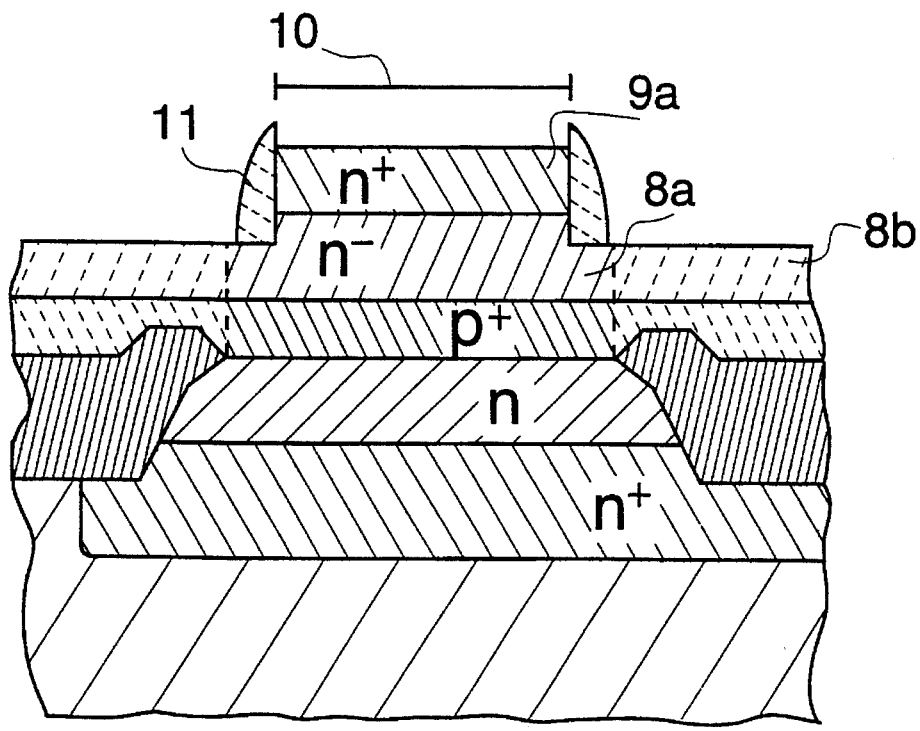
FIG. 1f is a cross sectional view similar to FIG. 1e showing an active emitter zone.

The deposited material is etched free from the monocrystalline area around an active emitter zone 10 to below the layer boundary between the highly doped emitter contact layer 9a to the slightly doped emitter layer 8a according to a prior-art process, wherein the surface area of the active emitter zone 10 is approximately equal to the surface extension of the series of layers grown in the monocrystalline form (FIG. 1f).

The remaining part of the slightly $n^-$-doped polycrystalline layer 8b can advantageously also be used as a base lead after the change in conductivity, besides the highly doped polycrystalline layer 7b, as a result of which the base lead resistance can be reduced. A ring 11 consisting of a shielding material, a so-called spacer, may be preferably prepared around the exposed active emitter zone 10 before the change in the conductivity of the polycrystalline $n^-$-doped layer 8b in a known manner, e.g., in the manner known from EP 0 355 799 A2 (FIG. 1f).

Figure 1G:
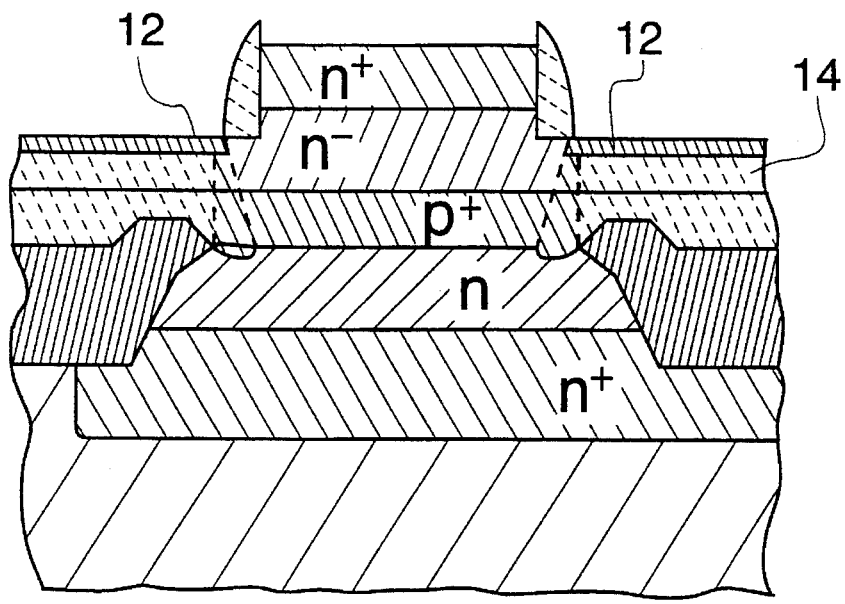
FIG. 1g is a cross sectional view similar to FIG. 1f, showing an electrically uniform, highly $p^{30}$-doped lead layer which is additionally converted into a silicide in an upper area.

Especially transdoping into another type of conductivity by implantation and partial conversion into a silicide, which may be employed individually or in combination, is advantageous for changing the conductivity of the polycrystalline layer 8b. The polycrystalline layer 7b is preferably additionally redoped in the case of the transdoping from $n^-$to $p^+$. The boundary between the polycrystalline material of layer 7b and the monocrystalline material of layer 7a is advantageously located in the area of the implantation and it is covered by the implantation, so that the poly-mono transition cannot electrically lead to disturbances. The implantation may also lead to a slight shift in the p-n-doping between the base and the collector, but this does not impair the functions of the transistor. An electrically uniform, highly $p^+$-doped lead layer 14 is formed, which is additionally converted into a silicide 12 in the upper area (FIG. 1g). A silicide may also be produced in the area of the emitter, i.e., on the layer 9a.

Figure 1H:
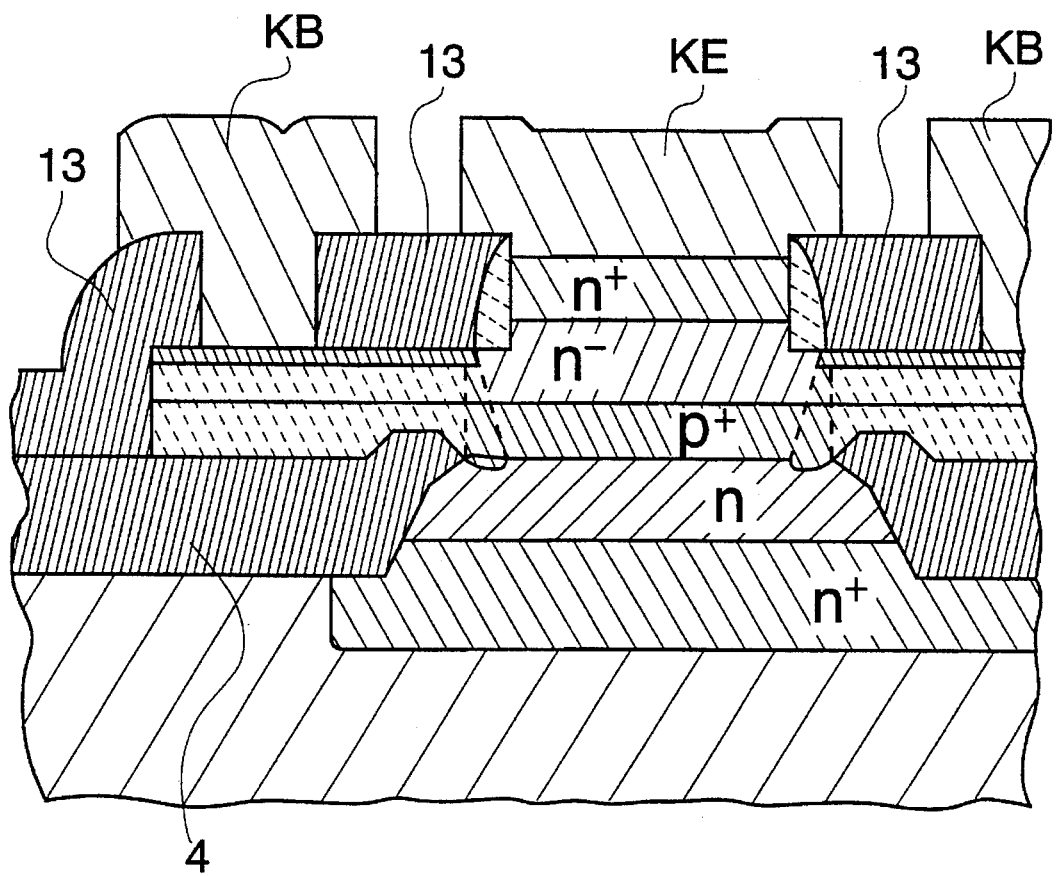
FIG. 1h is a cross sectional view similar to FIG. 1g, showing additional insulation layers in which windows are opened and metallic junction contacts for a base lead and for an emitter contact are prepared.

Another insulation layer 13, preferably $SiO_2$, in which windows are opened and metallic junction contacts KB for the base lead and KE for the emitter contact are prepared, is deposited on this arrangement. (FIG. 1h).

Figure 2A:
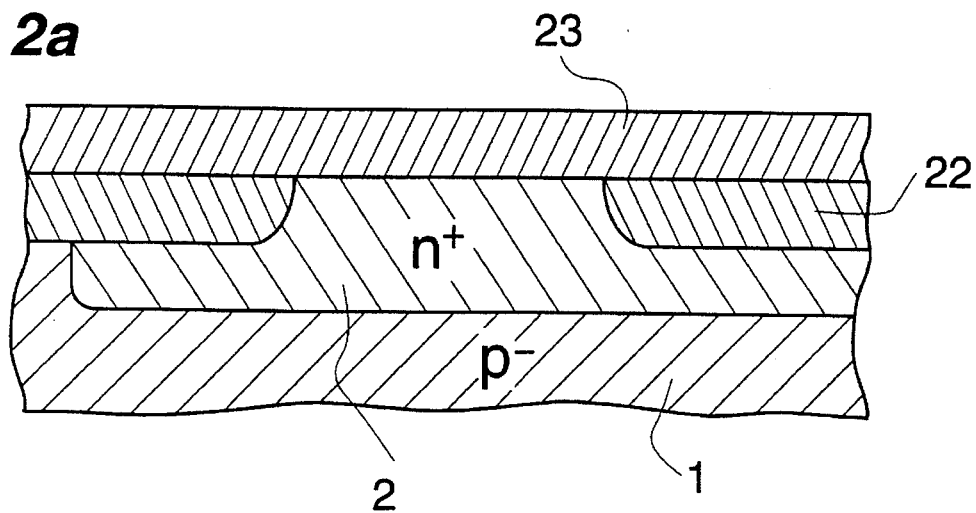
FIG. 2a is a cross sectional view showing an insulation layer applied to a highly $n^+$-doped trough in a slightly $p^-$-doped substrate.
Figure 2B:
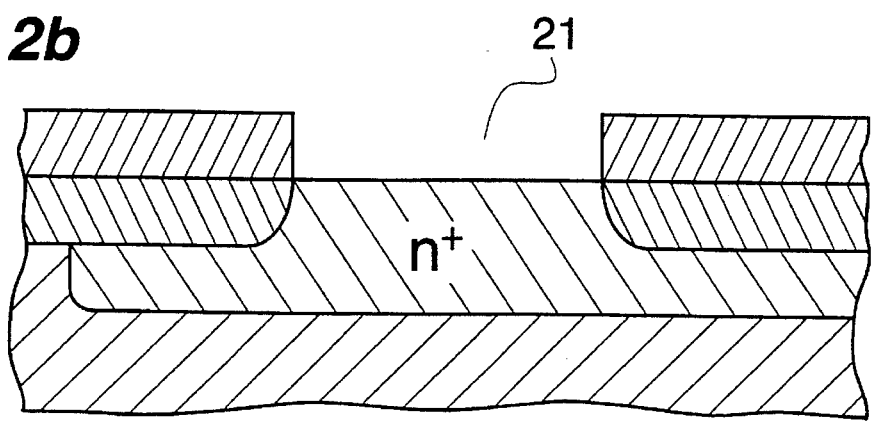
FIG. 2b is a view similar to FIG. 2a, further showing a window formed in the insulation layer, leading to the monocrystalline semiconductor surface.
Figure 2C:
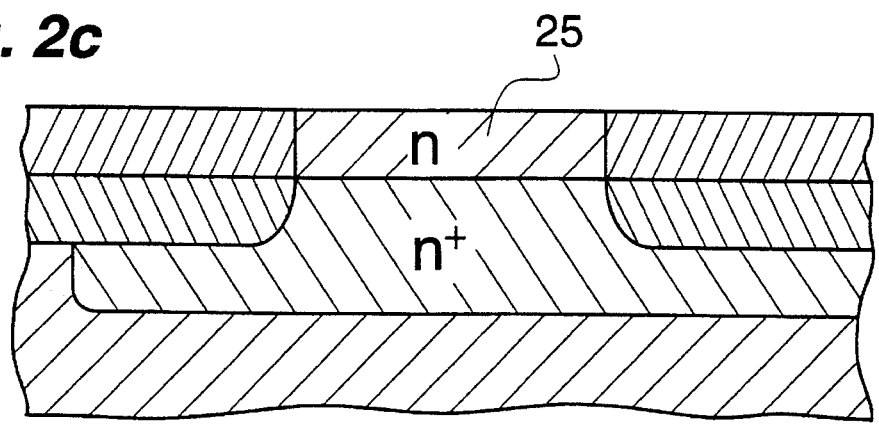
FIG. 2c is a sectional view similar to FIG. 2b, showing deposited n-doped semiconductor material in the monocrystalline form, defining a collector zone in the window of the insulation layer.

Instead of the structuring of the first layer by introducing insulation areas into a semiconductor layer, an alternative embodiment provides for the application of an insulation layer 23, preferably $SiO_2$, whose thickness is selected to be equal to the thickness intended for the collector zone, to the substrate 1 with the trough 2 (FIG. 2a). A window 21 leading to the monocrystalline semiconductor surface is exposed in this insulation layer (FIG. 2b). If a thicker insulation layer is desired for better insulation and/or for further reducing parasitic capacities, it is possible, based on a correspondingly deeper trough 2, to first prepare insulation layers 22 in the substrate 1 and the trough 2, e.g., according to one of the prior-art processes mentioned in connection with the first exemplary embodiment (LOCOS, groove insulation), and to deposit the insulation layer 23 thereon.

n-Doped semiconductor material in the monocrystalline form is deposited as a collector zone 25 in the window 21. The deposition is preferably performed selectively, i.e., without simultaneous deposition of material on the oxide layer. This has been known for common gas-phase epitaxial processes by a suitable setting of the gas composition. The growth time is selected to be such that the surface of the collector zone will border on the surface of the insulation layer 23 as planarly as possible (FIG. 2c). This is followed by the differential epitaxial step as is described in connection with FIG. 1d and the figures following it. It is particularly advantageous to carry out the selective growth of the collector zone and the subsequent differential growth in one epitaxial process, in which the parameters of epitaxy are changed over to differential deposition only for the transition from the selective deposition after reaching the necessary thickness of the collector zone.

The present invention is not limited to the preferred preparation of an npn-heterobipolar transistor described in detail, but it is also analogously applicable to complementary doping and to usual bipolar transistors. The material system is not limited to Si and SiGe. In particular, it is also possible to use III-V (from periodic table) semiconductor materials. A "collector-on-top" arrangement, in which the order of the transistor layers is reversed, is also possible. The bulges formed at the edges of the insulation areas during the local oxidation can be made planar according to standard processes before the differential epitaxy is begun.

Typical values of an SiGe-HBT prepared according to the present invention are:

for the preparation of the insulation areas with recessed LOCOS: a depth of 1 μm, for the collector zone 5: a doping of $5\times10^{16}$ cm$^{-3}$ and a layer thickness of 0.1–0.5 μm, for the base zone 7a and the corresponding polycrystalline layer 7b: an $Si_{0.8}Ge_{0.2}$ layer with a doping of $5\times10^{19}$ cm$^{-3}$ and with a thickness of 20–60 nm, for the emitter zone 8a: an Si layer with a doping of $1\times10^{18}$ cm$^{-3}$ and with a thickness of 40–200 nm, for the emitter contact 9a: an Si layer with a doping of $2\times10^{20}$ cm$^{-3}$ and with a thickness of 20–300 nm, for the width of the $SiO_2$ spacer 11: 100–200 nm, for the additional insulation layer 13: a thickness of 1 μm, and for the metallization of the contacts KB, KE and of the collector contact (not shown): a TiAu layer with a thickness of 1 μm, without the present invention being limited to these preferred ranges of values.

While specific embodiments of the invention have been shown and described in detail to illustrate the application of the principles of the invention, it will be understood that the invention may be embodied otherwise without departing from such principles.

What is claimed is:

1. A process for preparing a bipolar transistor, the process comprising the steps of:

providing a monocrystalline lead layer;

preparing a structured first layer with a collector zone and with insulation areas surrounding the collector zone, the structured first layer being prepared on the monocrystalline lead layer;

growing a series of monocrystalline transistor layers on the structured first layer over the collector zone by differential epitaxy and substantially at the same time, growing a series of polycrystalline layers over the insulation areas; and providing the polycrystalline layers as a base lead, said monocrystalline layers being grown as a series of layers of a heterobipolar transistor with a slightly doped emitter layer, one of said polycrystalline layers corresponding to said slightly doped emitter layer being employed as part of said base lead, one of said monocrystalline transistor layers forming a base layer;

transdoping said one of said polycrystalline layers corresponding to said slightly doped emitter layer into a conductivity type of said base layer, boundaries defined between said polycrystalline layers and said monocrystalline layers being included in said transdoping;

partially converting said one of said polycrystalline layers corresponding to said base layer into a silicide, said boundaries defined between said polycrystalline layers and said monocrystalline layers being also included in said silicide conversion;

etching free a portion of said series of polycrystalline layers around said series of monocrystalline layers to form an active emitter zone;

forming a ring of a material around said active emitter zone, shielding said active emitter zone from said transdoping along an exposed lateral boundary surface of said active emitter zone, said material of said ring also shielding said active emitter zone from said silicide conversion.

2. A process according to claim 1, wherein said insulation areas are selectively prepared in a collector layer forming said collector zone of said structured first layer.

3. A process according to claim 2, wherein said insulation areas are prepared by local oxidation of semiconductor material of said structured first layer.

4. A process according to claim 2, wherein:

grooves are etched into said structured first layer and insulation material is deposited in said grooves to form said insulation areas.

5. A process according to claim 1, wherein said collector zone is formed by providing an insulation layer in said structured first layer, forming a window in said insulation layer to expose said monocrystalline lead layer and epitaxially depositing monocrystalline semiconductor material in said window in a selective manner to define said collector zone.

6. A process according to claim 1, wherein:

a portion of said series of monocrystalline layers are exposed to form an active emitter zone.

7. A process according to claim 1, wherein said transdoping is performed by ion implantation.

8. A process according to claim 1, wherein: one of said monocrystalline transistor layers forms a base layer; deformed SiGe is grown for said base layer.

9. A process according to claim 1, wherein: one of said monocrystalline transistor layers forms a base layer; deformed SiGe is grown for said base layer.

10. A process according to claim 1, wherein:

said series of monocrystalline transistor layers include an emitter contact layer on top of said emitter layer.

11. A process according to claim 10 wherein:

said etching free of said polycrystalline layers removes substantially all of a polycrystalline layer corresponding to said emitter layer.

12. A process according to claim 11, wherein:

said etching free of said polycrystalline layers removes a portion of said polycrystalline layer corresponding to said emitter layer.

13. A process according to claim 5, wherein:

said growing of said monocrystalline transistor and polycrystalline layers are performed in one epitaxial process, wherein parameters of said epitaxial process are changed for said growing of said monocrystalline transistor layers by differential epitaxial and epitaxy.

* * * * *